United States Patent [19]

Truax

[11] 4,101,825

[45] Jul. 18, 1978

[54] ELECTRIC FIELD SENSOR

[76] Inventor: Robert L. Truax, 116 Fifth St., Fort Myers, Fla. 33901

[21] Appl. No.: 760,933

[22] Filed: Jan. 21, 1977

[51] Int. Cl.² .............................................. G01R 5/28
[52] U.S. Cl. ......................................... 324/32; 324/72
[58] Field of Search ..................... 324/32, 72; 361/217, 361/218

[56] References Cited

U.S. PATENT DOCUMENTS

| | | | |
|---|---|---|---|
| 3,600,632 | 8/1971 | Bright et al. | 361/217 |
| 3,761,803 | 9/1973 | Slough | 324/32 |
| 3,812,419 | 5/1974 | Kaunzinger et al. | 324/32 |
| 3,857,066 | 12/1974 | Cline et al. | 324/32 X |
| 4,005,357 | 1/1977 | Parkinson | 324/32 |

Primary Examiner—Rudolph V. Rolinec
Assistant Examiner—Vincent J. Sunderdick
Attorney, Agent, or Firm—Littlepage, Quaintance, Murphy, Richardson and Webner

[57] ABSTRACT

An electric field sensor for measuring the electric field outside a body having an electrically conductive surface, particularly a hovering aircraft, consists of a sensor element including a plate of electrically conductive material, a slab of dielectric material having a pair of opposite surfaces, a first of the pair of surfaces being fixed to the plate, and an electrometer means positioned within the body adjacent to a second of the pair of surfaces and arranged for measuring the electric field within the slab of dielectric material, the electrometer being calibrated to indicate the electric field outside the body on the basis of the measured electric field within the slab of dielectric material.

9 Claims, 4 Drawing Figures

ELECTRIC FIELD SENSOR

The United States Government has rights in this invention pursuant to contact number N00019-76-C-0221 awarded by the Department of the Navy.

BACKGROUND OF THE INVENTION

This invention relates to devices for measuring electrostatic field strength and particularly to devices for detecting and indicating the strength of an electrostatic field in the vicinity of a hovering aircraft such as a helicopter.

It is well known that the operation of an aircraft often tends to cause an accumulation of electrostatic charges through various effects including atmospheric conditions and the motion of the aircraft or parts thereof through the atmosphere. The accumulation of the electrostatic charges tends to build up potentials than can become dangerous and can cause radio frequency interference, electrical shock to persons connected with the aircraft, and unwanted ignition of fuel and armament. It therefore becomes necessary to provide an apparatus for measuring the strength of the electrostatic field between the aircraft and the surrounding environment in order to determine whether or not the electrostatic potential of the aircraft is at a dangerous level.

While several methods of measuring electric fields have been developed which have enjoyed varying degrees of success, it has been difficult to reliably determine the potential differences between a charged body and surrounding structures when the intervening atmosphere includes any substantial number of charged particles or ions. For example, when triboelectrically charged particles from a rotating helicopter rotor mixed with the ions resulting from corona discharge from the helicopter rotor are forced downward by the flow of air sustaining the helicopter in flight, the helicopter is immersed in a sea of charged particles and ions which all but prevent any meaningful measurement of electrical fields in the vicinity of the helicopter. Likewise, ions carried by a flowing fluid such as fuel through high velocity fuel pumps can create similar problems if potential difference measurements are attempted in an effort to reduce fire and explosion hazards. Often in such situations, ions and charged particles can become bound to nonconductive portions of the structure in the vicinity of the electric field sensor, resulting in apparent field modifications having little or no relation to the actual potential differences between the body as a whole and surrounding stuctures. Examples of electrostatic field measuring devices particularly adapted for use in environments of this type are illustrated in U.S. Pat. Nos. 3,260,893; 3,600,632; 3,812,419; 3,857,066; and 3,874,616. Attempts have been made to use the sensed field to signal an appropriate device to discharge the charged or charging body. The electrical discharge of aircraft is illustrative of such attempts and has been reasonably successful when the aircraft has enjoyed a sufficent velocity vector with respect to any triboelectrically charged particles and ion products, but has generally been unsuccessful in the case of hovering aircraft since the fluid borne electric charges adversely affect the electric field sensor's ability to accurately detect either the polarity or magnitude of the charge on the aircraft.

The electrostatic fields have typically been measured with the use of conventional electrometers of the so called field mill type. Generally, a field mill is a device for measuring electrostatic field strength on the basis of charges induced on a sensor electrode within the field mill which is either electrically or mechanically alternately covered and exposed to the electrostatic field sought to be measured. The induced charges on the sensor electrode of the field mill are proportional to the external field impinging on the sensor electrode. With appropriate phase convergence, both the strength and polarity of the electrostatic field sought to be measured can be determined.

It is an object of this invention to combine a conventional field mill with other appropriate apparatus so as to more accurately measure the electrostatic field surrounding a body. It is a further object of this invention to combine a conventional field mill with a sensing means postitioned so as to intercept or "short out" at least a portion of the equal potential lines surrounding the body and thus more accurately determine the electrical field strength. Yet a further object of this invention is to provide means by which the sensor means may be maintained free from any ion or charged particle buildup due to the presence of ions and charged particles in the surrounding fluid. A further object of this invention is to utilize an electric field sensor as herein disclosed to indicate the electric charge state of a body in such a manner that the indication may be used to operate an active discharge system to discharge the charged bodies.

SUMMARY OF THE INVENTION

An electrostatic field measuring device, according to this invention for measuring the electric field outside of a body, comprises a sensor element at least a portion of which is positioned externally to the body, and comprises at least in part a plate of electrically conductive material which is electrically insulated from the body. The apparatus further comprises a segment of dielectric material having a pair of opposite surfaces, a first of the pair of surfaces being fixed to the plate. The sensor element and the segment of dielectric material are joined to a conventional electrometer positioned within the body. The electrometer is arranged adjacent to the second of the pair of surfaces of the segment of dielectric material for measuring the electric field within the dielectric material. The electrometer is calibrated so as to indicate the electric field outside of a body on the basis of the measured electric field within the segment of dielectric material. The electrometer can also be arranged to detect the rate of change of the electric field with respect to time ($dE/dt$).

In the most basic embodiment the sensor element consists of a single electrically conductive plate arranged at a preselected distance outside of the body. In this embodiment the segment of dielectric material preferably comprises a dielectric extending from the plate continuously through an aperture in the body to a surface within the body against which the electrometer is positioned. This configuration can be viewed as an electromechanical analog to a Gaussian pillbox designed to sample the electrostatic field outside of a body by intercepting or "shorting" a portion of the equal potential field lines which exist about the charged body and from the information thus gained determine the charge on the body. This embodiment is most useful when free ions and charged particles will not impinge on the conductive sensor plate. The thickness and height of the dielectric material selected is dependent upon conventional design considerations such as potential differences anticipated, dielectric strength of the material selected, and lowest threshold of electric field strength necessary to obtain useful signals from the electrometer. The dimensions of the sensor plate may vary widely, being dependent only upon the objective of developing an electric field within the dielectric material suitable for detection by the electrometer used. In most applications the electrometer signal will be maximized by making the sensor plate slightly larger than the area of the electrometer's sensing aperture.

Where the sensor plate is to be exposed to fluidborne ions and charged particles, it becomes necessary to periodically drain away accumulated charge from the sensor plate. This is achieved by incorporating in the electrostatic field measuring device of this invention a normally open switch means attached to the sensor element and to the body about which the field is to be measured for periodically connecting the sensor element and body to eleminate any electric charge inbalance. It is usually desirable to disable the electrometer simultaneously with the closing of the switch means so as to avoid erroneous indication from the electrometer. In a preferred embodiment, the electrostatic field measuring device further comprises a signal sampling and storage means attached to the electrometer and to the switch means for periodically sampling and storing the indicated or measured electric field, the signals indicating the field to be sampled at least once between each closing of the normally open switch means thereby achieving a substantially continuous indication and record of the electrostatic field sought to be measured. The switching means can be either a mechanical device such as a relay or an electronic apparatus such as a triac and in each case will include appropriate means for triggering the switch means from its normally open or high impedance condition to its closed or high conduction condition. The disabling means can be attached to the swith means so as to activate or trigger the switch means in response to a given preselected indication on the electrometer or can be attached to the switch means so as to disable the electrometer in response to a self-initiated closing of the switch means or both. The signal storage and sampling means can be any of a number of devices to be found in the prior art for periodically sampling and storing electrical or electronic, digital or analog information indicative of any variable sought to be measured. Preferably the signal storage and sampling means is attached to the switch means such that the indication of field strength given by the electrometer is sampled as least once between each functioning of the switch means.

In a preferred embodiment, and particularly where an electrostatic field measuring device according to this invention is mounted within a helicopeter, the plate of the sensor element is mounted within a body of dielectric wholly contained within the helicopter. The sensor element further comprises an elongated linear member of electrically conductive material connected to the sensor plate and extending outward from the body a predetermined length so as to intercept a large number of equal potential force lines surrounding the body. The elongated linear member or drop line is itself insulated from the body by suitable dielectric materials. The drop line may be from rigid to non-rigid and is maintained in place, despite any fluid turbulence from any operating downwash, by means of an appropriate weight located near the end of the dropline. Ions and charged particles impinging on the drop line can be periodically discharged by means as previously described and/or by the use of a low threshold passive discharger mounted on the extreme lower end of the drop line. The drop line preferably contains a high resistance element mounted very close to the body so as to decrease the possibility of large current density discharges through the line which might be harmful to apparatus or personnel coming in contact with the line.

Additional features and advantages of an electrostatic field measuring device according to this invention will be appreciated by those skilled in the art upon further consideration of the following description of a preferred embodiment together with the attached figures.

DESCRIPTION OF PREFERRED EMBODIMENTS

Figure 1:
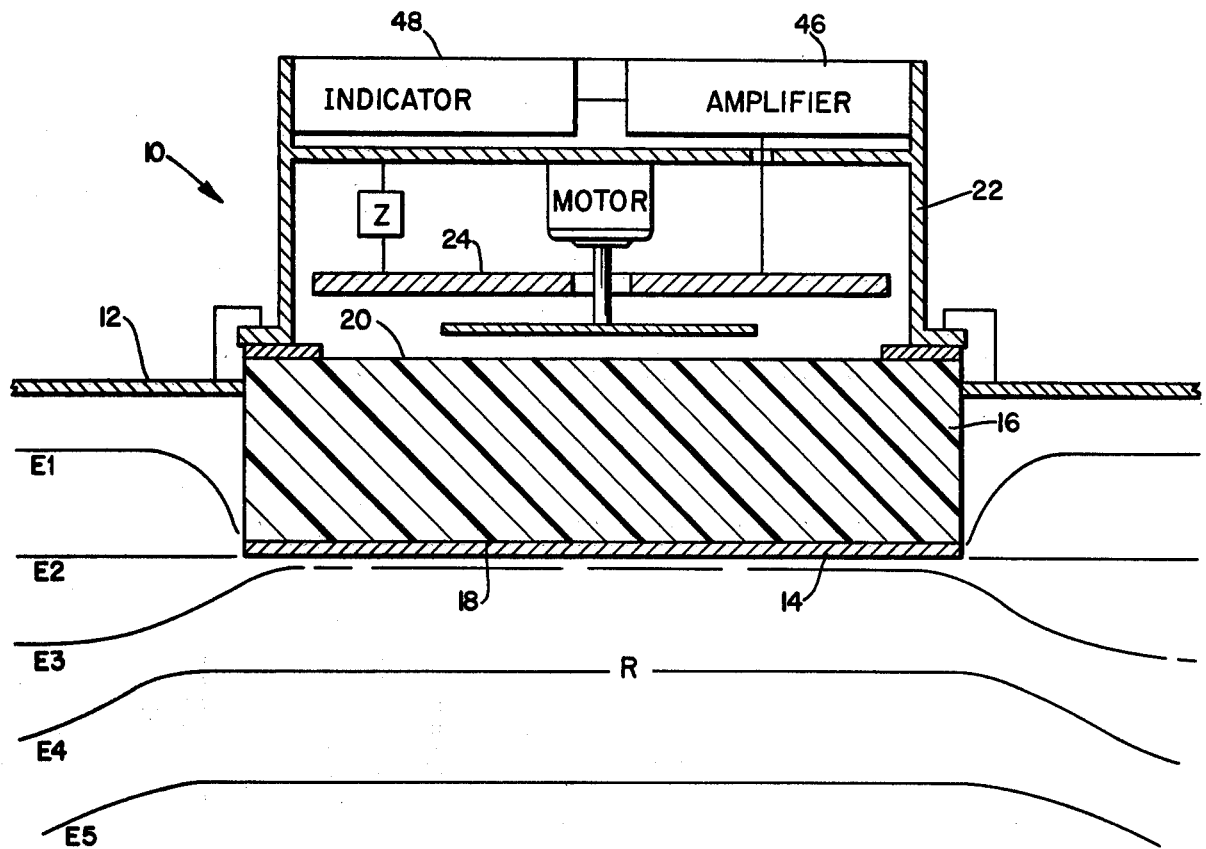
FIG. 1 schematically depicts the simplest embodiment of an electrostatic field measuring device according to this invention and has its primary utility where no charged particles or ions are free to impinge on the sensor plate.

In FIG. 1, an electrostatic field measuring apparatus 10 according to this invention is mounted in an aperture in the wall 12 of a body so as to measure the electric field in the region R outside the body. The electric field may be schematically represented by a series of equal potential surfaces; E1, E2, E3, etc. existing in the region R surrounding the body. The apparatus 10 for measuring the electric field E outside of the body comprises a sensor element 14 illustrated in FIG. 1 to comprise a plate of electrically conductive material electrically insulated from the body and positioned externally to the body. The apparatus 10 further comprises a segment of dielectric material 16 having a pair of opposite surfaces 18 & 20. A first of the surfaces 18 is fixed to the flat plate 14. The apparatus 10 further comprises an electrometer means 22 positioned within the body adjacent to the second of the pair of surfaces 20 and arranged for measuring the electric field within the slab of dielectric material 16. The electrometer means 22 is calibrated to indicate the electric field outside the body on the basis of the measured electric field within the slab of dielectric material 16. The electrometer means 22 preferably comprises a field mill which includes an electric field sensitive vane 24, the field mill being situated such that the electric field sensitive vane 24 and flat plate 14 are essentially parallel. The field mill may be of the conventional type as illustrated in U.S. Pat. No. 2,815,483 or alternatively of the newer electronic type as illustrated in U.S. Pat. No. 3,812,419. The sensor plate 14 extending outward from the wall 12 of the body acts to intercept or "short out" one or more of the equal potential surfaces surrounding the body and with the parallel electric field sensitive vane 24 forms a capacitor having a potential difference between the plates which can be measured by the electrometer means 22. The dielectric 16 may be of any suitable material ranging from natural dielectric materials to synthetic plastics and including air or vacuum properly encased.

Figure 2:
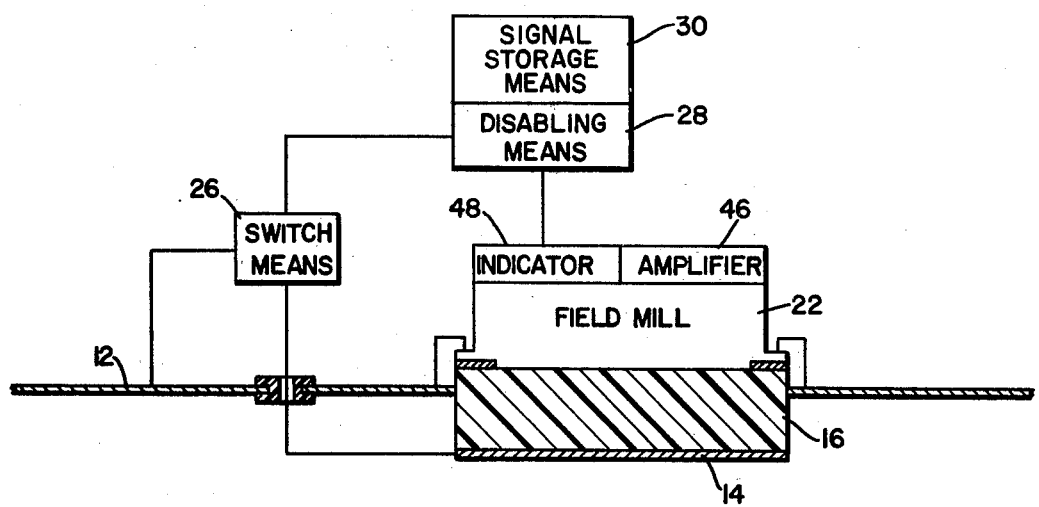
FIG. 2 schematically illustrates an improved version of the invention shown in FIG. 1 which provides means for periodically draining any charged particles and ions from the sensor plate while temporarily disabling the electrometer.

As illustrated in FIG. 2, the electrostatic field measuring device according to this invention comprises sensor element 14, the segment of dielectric material 16 and the electrometer means 22 as previously described and additionally certain other elements intended to permit the device to operate even in the presence of fluid borne ions and charged particles. Attached to the sensor element 14 and to the wall of the body 12 is a normally open switch means 26 for periodically connecting the sensor element 14 and body 12 to eliminate any undesired electric charge imbalance between the two. The switch means 26 thus periodically drains any charge from the sensor element 14 resulting from the impingement of ions and charged particles onto the sensor element 14. These switch means 26 can be either electromechanical or electronic yet still perform the intended function. Preferably the switch means 26 is further connected to a disabling means 28 attached to the electrometer means 22 for temporarily disabling the electrometer means 22 each time the switch means 26 functions to eliminate the accumulated charges on sensor element 14. The disabling means 28 can again be either an electromechanical or electronic means capable of performing the intended function. In this embodiment the electrostatic field measuring apparatus also preferably includes a signal storage means 30 attached to the switch means 26 and to the electrometer means 22 for periodically sampling, storing and comparing the indicated electric field measured by the electrometer means 22. The signal storage means 30 is preferably maintained so as to sample the indicated field at least once between each functioning of the switch means 26 thereby generating a continuous record of the measured electric field.

Figure 3:
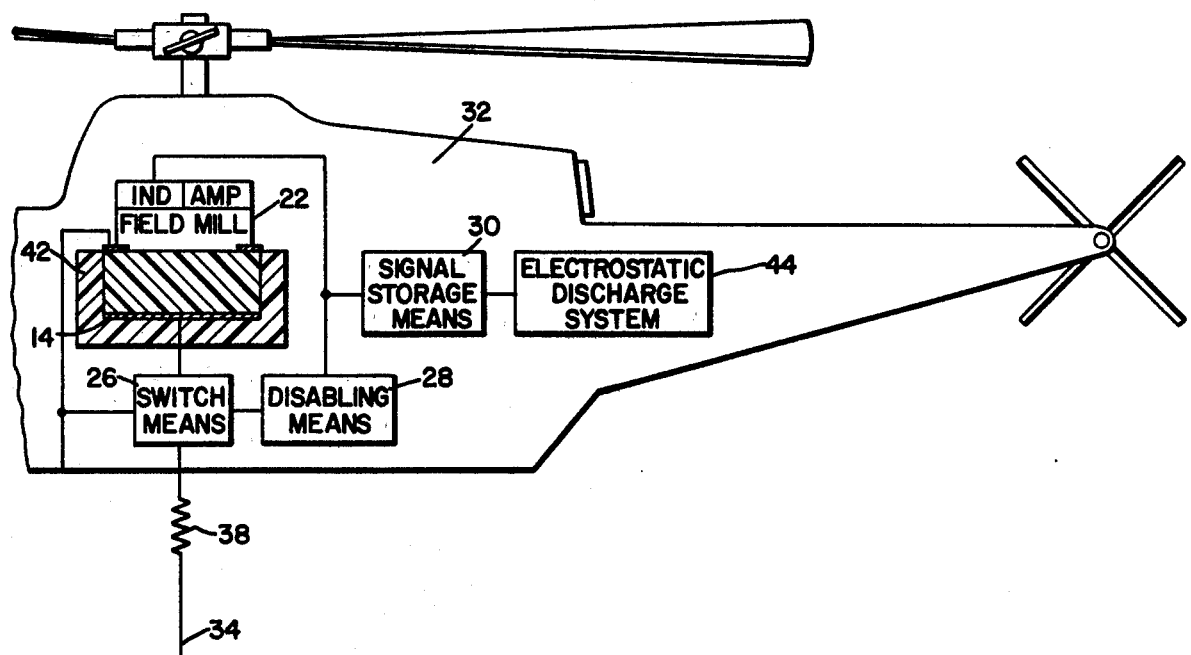
FIG. 3 illustrates a still further refinement of the invention and particularly illustrates its use for determining the electric charge state of a hovering aircraft.

In FIG. 3, there is illustrated an embodiment of the present invention particularly suited to determining the electric field about a hovering aircraft 32. The electrostatic field measuring device in this embodiment comprises a sensor element including plate 14 and an elongated linear member 34 of electrically conductive material electrically connected to the plate 14. The elongated linear member 34 is electrically insulated from the aircraft 32 and extends generally downward from the aircraft 32 despite any downwash or air turbulence by means of a weight 36 placed near the end of the elongated linear member 34. The member 34 is preferably a multistranded cable of conductive material but includes, either continuously throughout or as an independent discrete element, a resistance means 38 to prevent large currents in the elongated linear member 34. At the extreme lower end of the linear member 34 is a passive discharge means 40 typically used to control corona discharge aboard aircraft. The electrometer means 22 switch means 26 disabling means 28 and signal storage means 30 are essentially the same and perform the same intended function as that discussed with the apparatus indicated in FIG. 2. It will be noted that the sensor plate 14 is now found wholly within the aircraft's body 32 and is further encased in a second layer of dielectric material 42 to prevent electrical contact with the aircraft 32 and therefore more accurately reflect the electrical field existent below the aircraft in the region of the elongated member 34. It will be appreciated that the elongated member 34 can extend outward from the aircraft 32 a much greater distance than the dielectric body 16 illustrated in FIG. 1 and thus intercept a greater number of equal potential surfaces in the region or outside the body and as a consequence more accurately indicate the surrounding electric field.

As illustrated the signal storage means 30 can be utilized to provide information to a conventional active electrostatic discharge system 44 for dispensing ions of the proper charge so as to maintain the electrostatic potential of the aircraft as low as possible with respect to the surrounding environment. In experimental test flights of an electrostatic field measuring device according to this invention as illustrated in FIG. 3, it was noted that a good approximation of the potential difference between the hovering aircraft and the earth prior to contact of the drop line and the earth was experienced. It is believed that the enhanced sensitivity of the measurement is due at least in part to the existance of the several foot length of drop line that extends below the aircraft thereby intercepting a considerable portion of the equal potential force lines which surround the aircraft.

It will be appreciated that when the drop line 34 contacts the earth, an extremely accurate measurement of potential difference between the aircraft and the earth can be made. In such a case the electrostatic field measuring device according to this invention performs the same function as an infinite impedance volt meter. The potential between the aircraft and the earth can thus be calibrated by utilizing a drop line 34 of variable length and maintaining the hovering aircraft at certain preselected altitudes to establish a repeatable pattern of electric potential. The drop line 34 can then be shortened to a more generally utilized length of only a few feet and the field again measured by repeating the previous flight patterns and the indicated fields being correlated with the previously known potentials so as to calibrate the field measuring equipment.

In a series of experimental flights it has been acceptably demonstrated that when the electrostatic field measuring device illustrated in FIG. 3 is coupled with an appropriate active electrostatic discharge system 44, the hovering aircraft can be discharged to residual energy levels in the micro-joule region.

Figure 4:
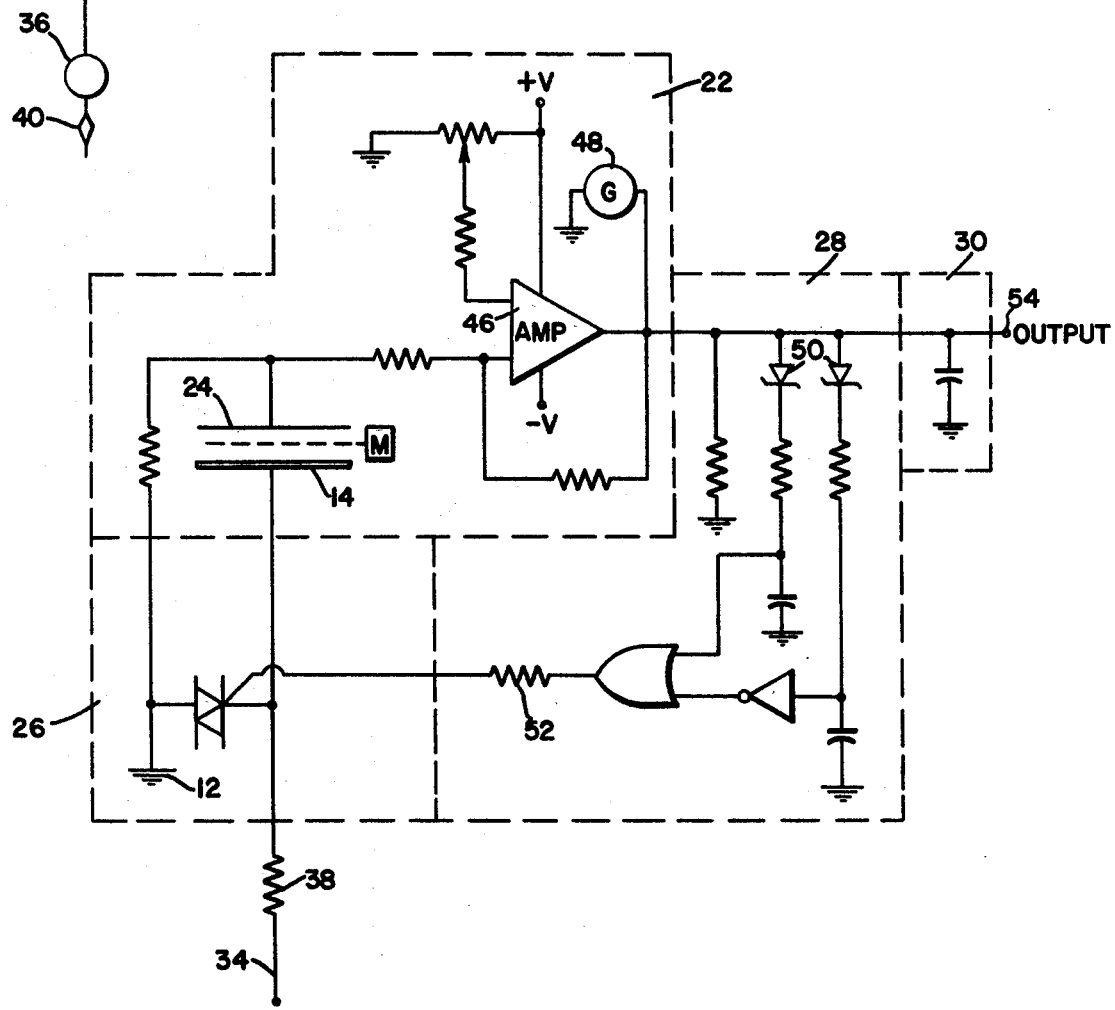
FIG. 4 is a schematic for one embodiment of the invention which could be used in the environment of FIG. 3.

One embodiment of the circuitry of the invention is shown in FIG. 4. This circuitry can be used in the environment illustrated in FIG. 3. In FIG. 4 the electrometer means 22 is shown to include the field sensitive vane 24 which is periodically either mechanically or electrically shielded from the sensor element 14 by means M. The field sensitive vane 24 is connected to amplifier means 46 for amplifying the signals sent by the field sensitive vane 24. An indicator means 48 may be included to indicate both the polarity and magnitude of the field sensed.

The disabling means 28 includes means 50 for sensing signal levels from the output of the amplifier 46 which are above a preset minimum value in magnitude. The means 50 are so constructed that a signal of the established minimum magnitude and of either polarity will trigger the disabling means 28 to function. The disabling means 28 is connected by way of an appropriate current limiting device 52 to the switch means 26 which is illustrated in FIG. 4 to be a triac connecting the linear member 34 to the aircraft chassis 12. The signal storage means 30 is shown to consist simply of a capacitor of an appropriate value which continuously reflects the output potential of the amplifier 46. The output 54 can be attached to a conventional electrostatic discharge system 44 as illustrated in FIG. 3. While the forms of apparatus herein described constitute preferred embodiments of the invention, it is to be understood that the invention is not limited to these precise forms of apparatus and that changes may be made without departing from the scope of the invention which is defined in the appended claims.

I claim:

1. An electrostatic field measuring device for measuring the electric field outside a body comprising:
   a. a sensor element comprising a plate of electrically conductive material electrically insulated from the body, the sensor plate being positioned wholly within the body,
   b. a segment of dielectric material having a pair of opposite surfaces, a first of the pair of surfaces being fixed to the plate,
   c. an electrometer means positioned within the body adjacent to the second of the pair of surfaces of said segment of dielectric material and arranged for measuring the electric field within said segment of dielectric material, the electrometer being calibrated to indicate the electric field outside the body on the basis of the measured electric field within the segment of dielectric material, and
   d. an elongated linear member of electrically conductive material extending outward from said body, the elongated linear member being electrically connected to said plate and electrically insulated from the body.

2. The invention of claim 1 wherein said electrometer means comprises a field mill including an electric field sensitive vane, the field mill being situated such that the electric field sensitive vane and said plate are essentially parallel.

3. The invention in claim 1 further comprising a normally open switch means attached to said sensor element and to said body for periodically connecting the sensor element and body to eliminate any undesired electric charge imbalance between the body and sensor element.

4. The invention of claim 3 further comprising disabling means attached to said switch means and to said electrometer means for temporarily disabling the electrometer means each time the switch means functions to eliminate said undesired charge imbalance.

5. The invention of claim 3 further comprising signal storage means attached to said switch means and to said electrometer means for periodically sampling, storing and comparing the indicated measured electric field, the indicated field to be sampled between functionings of the switch means.

6. The invention of claim 1 wherein said elongated linear element further comprises a passive electrical discharge device located at the remote end of the linear element from said body.

7. The invention of claim 1 wherein said elongated linear element further comprises resistor means for limiting the electrical current flowing in the linear element.

8. An electrostatic field measuring device for measuring the electric field outside a body comprising:
   a. a sensor element comprising a flat plate of electrically conductive material electrically insulated from the body, an elongated linear member of electrically conductive material connected to the flat plate and electrically insulated from the body, the elongated linear member extending outward from the body and including a resistor means for limiting the current flowing in the linear member.
   b. a segment of dielectric material having a pair of parallel opposite surfaces, a first of the pair of surfaces being fixed to said flat plate,
   c. an electrometer means positioned within the body adjacent to the second of the pair of surfaces of said segment of dielectric material and arranged for measuring the electric field within said segment of dielectric material, the electrometer means being calibrated to indicate the electric field outside the body on the basis of the measured electric field within the segment of dielectric material,
   d. a normally open switch means attached to said sensor element and to said body for periodically connecting the sensor element and body to eliminate any electric charge imbalance between the body and sensor element,
   e. disabling means attached to said switch means and to said electrometer means for triggering the switch means into a closed position when the electrometer means output reaches a preselected magnitude, and
   f. signal storage means attached to said electrometer means for storing the indicated measured electric field.

9. The invention of claim 8 wherein the normally open switch means is a triac having the triggering electrode connected to said disabling means.

* * * * *